United States Patent
Chang et al.

(10) Patent No.: US 10,707,266 B2
(45) Date of Patent: Jul. 7, 2020

(54) MICRO LED DISPLAY PANEL WITH DOUBLE-SIDES DISPLAY

(71) Applicant: Century Micro Display Technology (Shenzhen) Co., Ltd., Shenzhen (CN)

(72) Inventors: Wei-Chih Chang, New Taipei (TW); Chung-Wen Lai, New Taipei (TW)

(73) Assignee: Century Micro Display Technology (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 16/197,387

(22) Filed: Nov. 21, 2018

(65) Prior Publication Data

US 2019/0157341 A1 May 23, 2019

Related U.S. Application Data

(60) Provisional application No. 62/590,280, filed on Nov. 23, 2017.

(51) Int. Cl.

| | |
|---|---|
| *H01L 33/00* | (2010.01) |
| *H01L 27/15* | (2006.01) |
| *H01L 27/12* | (2006.01) |
| *G09G 3/32* | (2016.01) |
| *H01L 25/075* | (2006.01) |

(Continued)

(52) U.S. Cl.
CPC ............ *H01L 27/156* (2013.01); *G09G 3/32* (2013.01); *H01L 25/0753* (2013.01); *H01L 27/124* (2013.01); *H01L 27/3262* (2013.01); *H01L 29/41733* (2013.01); *H01L 33/62* (2013.01); *G06F 3/1423* (2013.01); *G09G 2300/023* (2013.01); *G09G 2300/08* (2013.01)

(58) Field of Classification Search
CPC ............ H01L 27/3262; H01L 25/0753; H01L 29/41733; H01L 29/42384; H01L 29/4908; H01L 33/08; H01L 33/405; H01L 33/46; H01L 27/32; H01L 27/3258; H01L 27/326; H01L 33/58; H01L 33/06; H01L 33/60; H01L 27/15; H01L 2933/0091; H01L 2933/0058; H01L 33/62; H01L 27/156
See application file for complete search history.

(56) References Cited

U.S. PATENT DOCUMENTS 10,008,610 B2 * 6/2018 Park .................... H01L 25/0753
10,177,195 B2 * 1/2019 Ahmed ................. H01L 27/156
(Continued)

FOREIGN PATENT DOCUMENTS

TW 200719753 A 5/2007

*Primary Examiner* — Shouxiang Hu
(74) *Attorney, Agent, or Firm* — ScienBiziP, P.C.

(57) ABSTRACT

A micro LED display panel able to display images from opposite surfaces includes a substrate, a pixel circuit layer on the substrate, an insulating layer on the pixel circuit layer, at least two micro LEDs on the insulating layer and embedded in the insulating layer, at least two first electrodes, and at least one second electrode. The pixel circuit layer includes at least two TFTs. Each micro LED includes a first end adjacent to the pixel circuit layer and a second end opposite to the first end and exposed from the insulating layer. Each first electrode is between the first end of each micro LED and the pixel circuit layer. The second electrode covers the second end of each micro LED and is transparent. Each first electrode defines a light transmitting region to allow light emitted from the micro LED to pass through.

8 Claims, 4 Drawing Sheets

(51) Int. Cl.
    *H01L 33/62*      (2010.01)
    *H01L 29/417*      (2006.01)
    *H01L 27/32*      (2006.01)
    *G06F 3/14*      (2006.01)

(56) References Cited

U.S. PATENT DOCUMENTS

| | | | |
|---|---|---|---|
| 10,325,893 B2 * | 6/2019 | Chong | H01L 33/00 |
| 10,431,723 B2 * | 10/2019 | Perkins | H01L 33/60 |
| 2014/0367705 A1 * | 12/2014 | Bibl | H01L 33/44 |
| | | | 257/88 |
| 2017/0062674 A1 * | 3/2017 | Kwon | H01L 33/58 |

\* cited by examiner

MICRO LED DISPLAY PANEL WITH DOUBLE-SIDES DISPLAY

FIELD

The subject matter herein generally relates to a micro light emitting diode (LED) display panel with double-sides display.

BACKGROUND

A micro light emitting diode (LED) display panel includes a thin film transistor (TFT) substrate and micro LEDs spaced apart from each other on the TFT substrate. The micro LED display panel generally displays images from one surface.

Therefore, there is room for improvement in the art.

BRIEF DESCRIPTION OF THE DRAWINGS

Implementations of the present technology will now be described, by way of embodiment, with reference to the attached figures.

DETAILED DESCRIPTION

Figure 1:
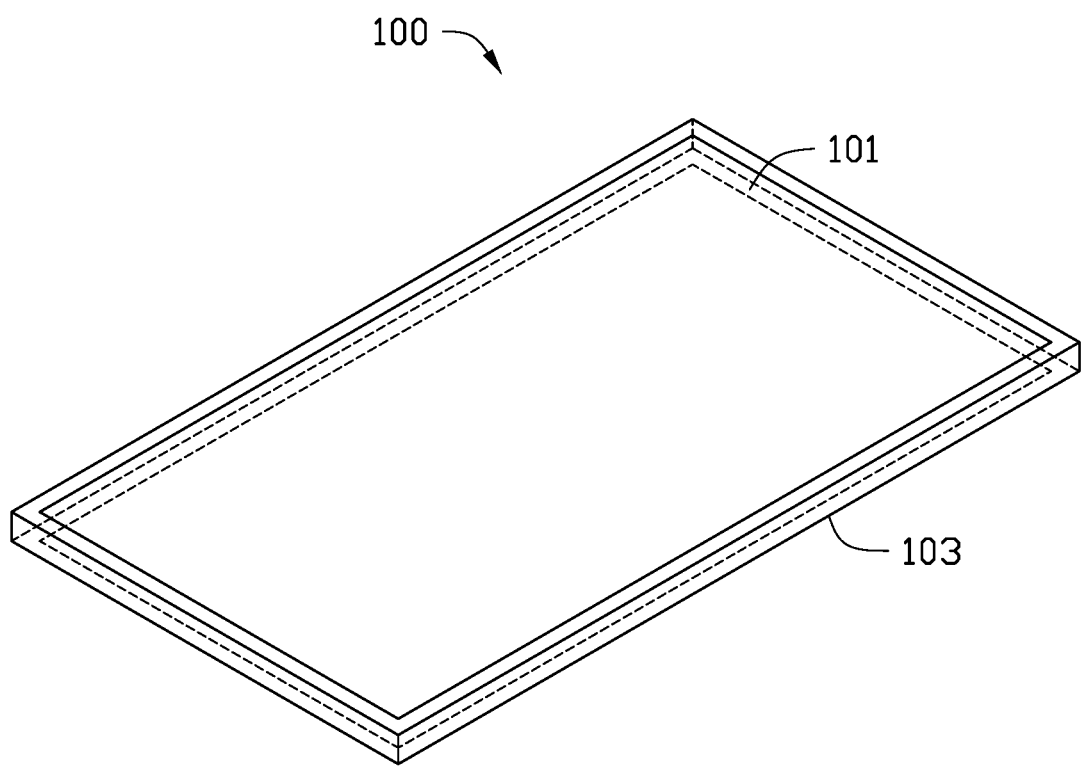
FIG. 1 is an isometric view of a micro LED display panel according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like. The term "micro LED" herein refers to an LED having a size of a few millimeters or less (for example, several millimeters, several hundred micrometers, or less than or equal to 100 micrometers).

FIG. 1 illustrates a micro LED display panel 100. The micro LED display panel includes a first surface 101 and a second surface 103. The first surface 101 and the second surface 103 are on opposite sides facing away from each other. Both the first surface 101 and the second surface 103 can display images. Opposite sides of the micro LED display panel 100 can display images.

Figure 2:
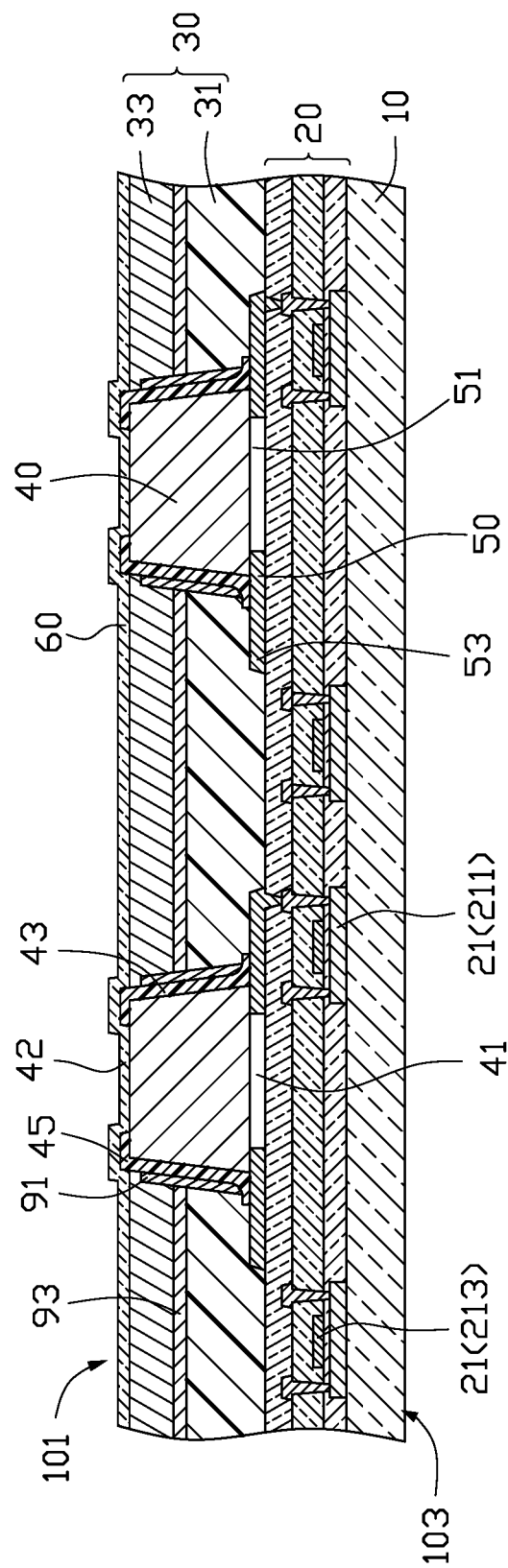
FIG. 2 is a cross-sectional view of part of the micro LED display panel of FIG. 1.

Referring to FIG. 2, the micro LED display panel 100 includes a substrate 10, a pixel circuit layer 20 on the substrate 10, and an insulating layer 30 on a side of the pixel circuit layer 20 away from the substrate 10. The micro LED display panel 100 further includes a plurality of micro LEDs 40 located on a side of the pixel circuit layer 20 away from the substrate 10 and embedded in the insulating layer 30. The micro LEDs 40 are spaced apart from each other. The pixel circuit layer 20 includes at least two electrically insulating layers (not shown) disposed in a stacked manner, and a plurality of thin film transistors (TFTs) 21, a plurality of scanning lines (not shown), and a plurality of data lines (not shown) in the electrically insulating layers.

As shown in FIG. 2, the micro LED display panel 100 further includes a plurality of first electrodes 50 and at least one second electrode 60 on a side of the insulating layer 30 away from the substrate 10. The first electrodes 50 are spaced apart from each other. Each of the first electrodes 50 is located between one micro LED 40 and the pixel circuit layer 20. Each of the micro LEDs 40 has a first end 41 adjacent to the pixel circuit layer 20 and a second end 42 opposite to the first end 41. Each of the first electrodes 50 is located at the first end 41 of the micro LED 40. The second end 42 of each of the micro LEDs 40 is exposed from the insulating layer 30, and the second electrode 60 covers the second end 42 of the micro LED 40. In one embodiment, all of the micro LEDs 40 share one second electrode 60, i.e., the second electrode 60 covers the second ends 42 of all of the micro LEDs 40. In another embodiment, there are a plurality of second electrodes 60 and each of the second electrodes 60 corresponds to and covers each of the micro LEDs 40. Each of the first electrodes 50 and each of the second electrodes 60 are respectively coupled to opposite ends of the micro LEDs 40 and are used as a cathode and an anode of the micro LEDs 40. When an electrical potential difference is formed between the first electrode 50 and the second electrode 60, the micro LEDs 40 emit light.

Figure 3:
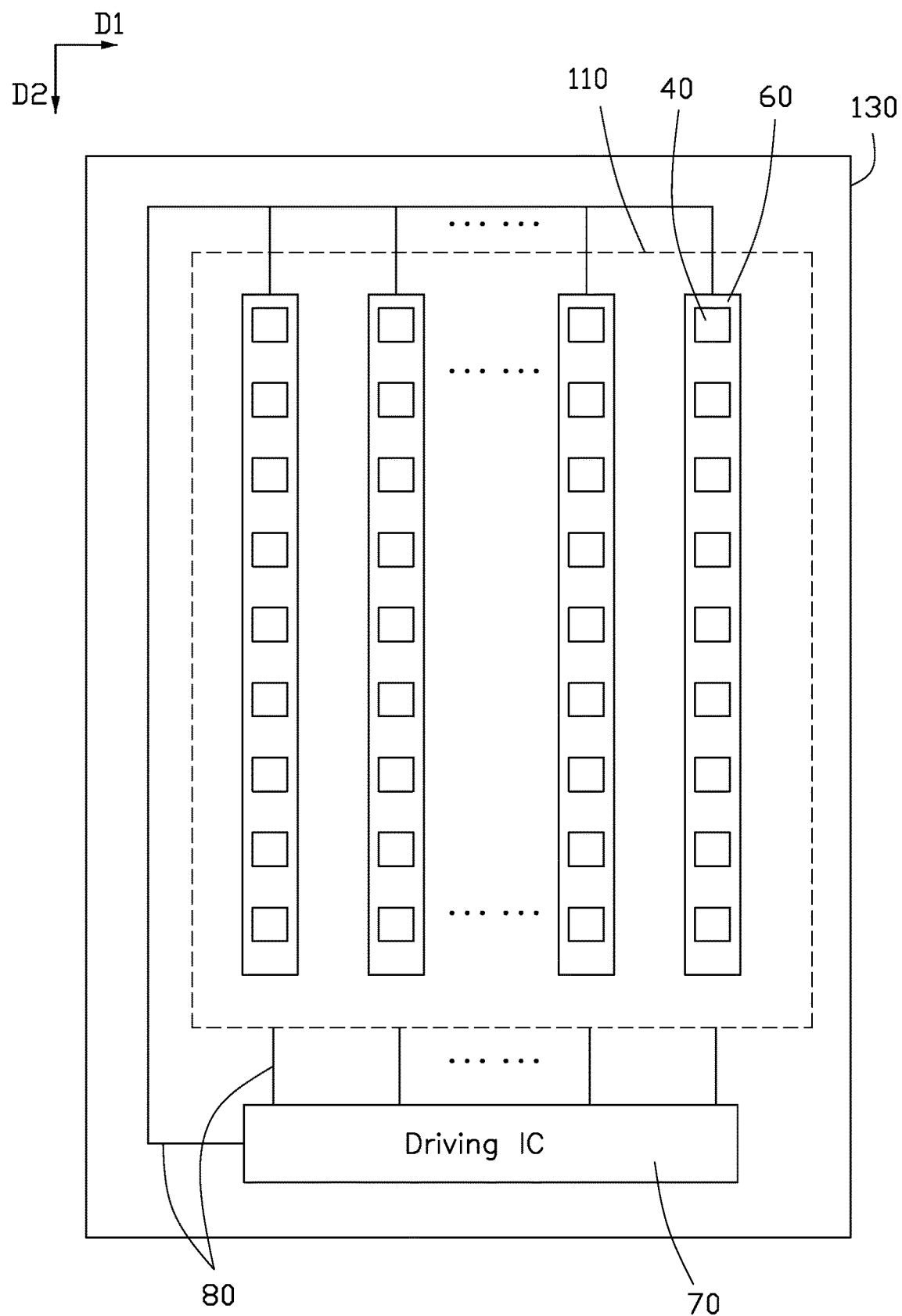
FIG. 3 is a plan view of the micro LED display panel of FIG. 1.

As shown in FIG. 3, the micro LEDs 40 are arranged in a matrix having a plurality of rows extending in a first direction (direction D1 in FIG. 3) and a plurality of columns extending in a second direction (direction D2 in FIG. 3). In the present embodiment, each of the columns of the micro LEDs 40 shares one of the second electrodes 60 and each of the second electrodes 60 extends in a strip to cover one column of the micro LEDs 40. The micro LED display panel 100 defines a display area 110 and a non-display area 130 surrounding the display area 110. The micro LEDs 40 are located in the display area 110. The micro LED display panel 100 also includes a driving IC 70 located in the non-display area 130. Each of the second electrodes 60 is electrically coupled to the driving IC 70 by a conductive line 80. The driving IC 70 is also electrically coupled to the pixel circuit layer 20 by a plurality of conductive lines 80 to transmit electrical signals to the pixel circuit layer 20.

Each of the second electrodes 60 is transparent. When the micro LEDs 40 emit light, light will pass through the second electrodes 60 transmit light from the micro LEDs 40 to the first surface 101 for viewing.

As shown in FIG. 2, each of the first electrodes 50 has a larger cross sectional area than that of each of the micro LEDs 40 coupled to the first electrode 50. A projection of the first electrode 50 on the substrate 10 is greater than a projection of the micro LED 40 coupled to the first electrode 50 on the substrate 10. Each of the first electrodes 50 extends beyond each of the micro LEDs 40. The first electrode 50 includes a light transmitting region 51 facing the micro LED 40 and a non-light transmitting region 53. Light from the micro LED 40 can pass through the light transmitting region 51, but cannot pass through the non-light transmitting region 53 of the first electrode 50. In the present embodiment, the light transmitting region 51 is a through hole 51 of the first electrode 50. The non-light transmitting region 53 of the first electrode 50 is made of a nontransparent conductive material, such as copper. In other embodiments, the light transmitting region 51 is made of a transparent conductive material and the non-light transmitting region 53 is made of a nontransparent conductive material.

Figure 4:
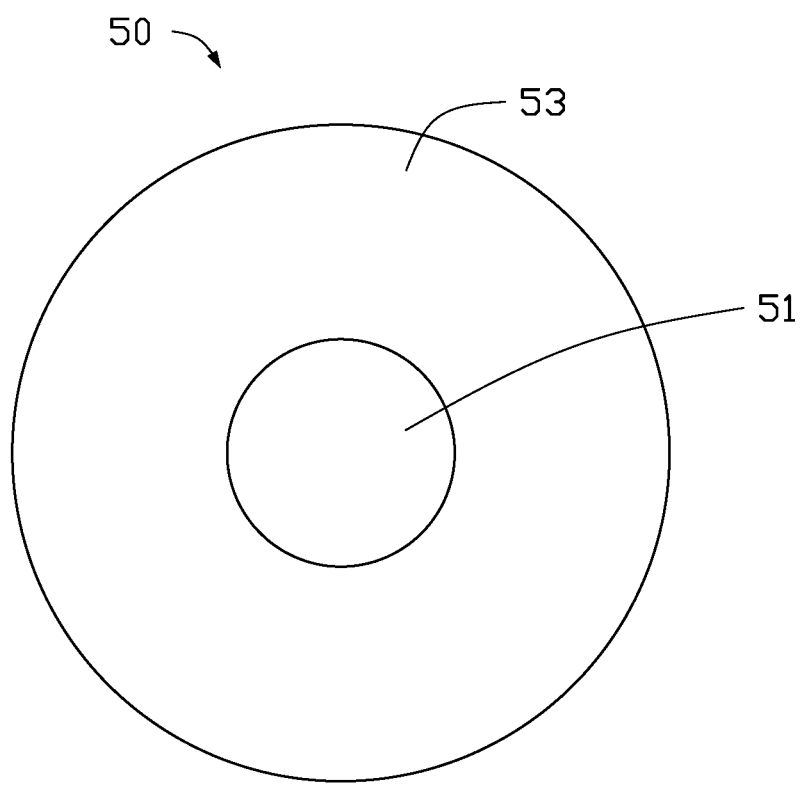
FIG. 4 is a plan view of a first electrode of the micro LED display panel of FIG. 1.

As shown in FIG. 4, the first electrode 50 is circular. The light transmitting region 51 is the through hole 51 and located in a center of the first electrode 50. The non-light transmitting region 53 surrounds the through hole 51.

In other embodiments, the entire first electrode 50 can be entirely transparent and made of a conductive material, such as indium tin oxide. In this embodiment, the first electrode 50 does not comprise any through hole.

As shown in FIG. 2, the TFTs 21 comprise at least two types: a driving TFT 211 and a switching TFT 213. Each of the first electrodes 50 is electrically coupled to the driving TFT 211, specifically a drain electrode of the driving TFT 211, by extending through an electrically insulating layer of the pixel circuit layer 20. The switching TFT 213 controls power on and off of the driving TFT 211. Each of some TFTs 21 is located under one non-light transmitting region 53 and overlap with the one non-light transmitting region 53 and each of other TFTs 21 is located in a position overlapping two adjacent micro LEDs 40. Each of the TFTs 21 is a conventional TFT, including a gate electrode (not shown), a semiconductor layer (not shown), a source electrode (not shown), and a drain electrode (not shown).

For light emitted from the micro LED 40 to pass through the second surface 103 of the micro LED display panel 100, regions of the pixel circuit layer 20 overlapping the light transmitting region 51 of the first electrode 50 be transparent. The substrate 10 is also light transmissive. Therefore, the substrate 10 is made of a transparent insulating material, such as transparent plastic or transparent glass. The electrical insulating layer in the pixel circuit layer 20 is also transparent, such as various transparent insulating materials conventionally used in the art. Light emitted from the micro LED 40 can thus pass through the second surface 103 and display images.

As shown in FIG. 2, the insulating layer 30 includes a first insulating layer 31 on the pixel circuit layer 20 and a second insulating layer 33 on the first insulating layer 31. Each of the micro LEDs 40 is embedded in the first insulating layer 31 and the second insulating layer 33 and is exposed from the second insulating layer 33. As shown in FIG. 2, the second electrode 60 is located on a side of the second insulating layer 33 away from the first insulating layer 31, and the second electrode 60 directly contacts and covers at least one of the micro LEDs 40. One of the first insulating layer 31 and the second insulating layer 33 is made of a light absorbing material, such as a black matrix material.

As shown in FIG. 2, each of the micro LEDs 40 includes a sidewall 43 connecting a first end 41 and a second end 42 opposite to the first end 41, the sidewall 43 couples to each of the first insulating layer 31 and the second insulating layer 33. The sidewall 43 of each of the micro LEDs 40 is covered with a dielectric layer 45 to protect an outer surface of the micro LED 40, and functions as an insulator. In the present embodiment, the dielectric layer 45 also extends to partially cover the second end 42 of the micro LED 40. The portion of the second end 42 of each of the micro LEDs 40 that is not covered by the dielectric layer 45 is covered by the second electrode 60.

The sidewall 43 of each of the micro LEDs 40 is also covered by an adjusting electrode 91. The adjusting electrode 91 surrounds the sidewall 43 of the micro LED 40. The adjusting electrode 91 is formed on a side of the dielectric layer 45 away from the micro LED 40. The dielectric layer 45 is between one micro LED 40 and the adjusting electrode 91. The adjusting electrode 91 does not contact the first electrode 50 and the second electrode 60 and is electrically insulated from both the first electrode 50 and the second electrode 60.

As shown in FIG. 2, the micro LED display panel 100 further includes at least one connecting electrode 93. The connecting electrode 93 is located between the first insulating layer 31 and the second insulating layer 33. The connecting electrode 93 is in direct contact with and electrically coupled to the adjusting electrode 91. The connecting electrode 93 applies a regulating voltage to the adjusting electrode 91. The regulating voltage is a direct current voltage that is different from an anode voltage and a cathode voltage of the micro LED 40.

The adjusting electrode 91 and the first electrode 50 form an electric field and the adjusting electrode 91 and the second electrode 60 form another electric field. The flow directions of carriers (electrons and holes) inside of the micro LED 40 is thereby restricted, and performance of the micro LED 40 is improved.

In the present embodiment, the micro LEDs 40 include three different types, each type emitting red light, blue light, and green light. In the present embodiment, each of the micro LEDs 40 is a conventional micro LED including a P-type doped light emitting layer (not shown), an active layer (not shown), and an N-type doped light emitting layer (not shown). The active layer is located between the P-type doped light emitting layer and the N-type doped light emitting layer. The P-type doped light emitting layer is relatively close to the first electrode 50, and the N-type doped light emitting layer is relatively far from the first electrode 50. Alternatively, the N-type doped light emitting layer can be relatively close to the first electrode 50, and the P-type doped light emitting layer can be relatively far from the first electrode 50.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:
1. A micro light emitting diode (LED) display panel, comprising:
a substrate;
a pixel circuit layer on the substrate, the pixel circuit layer comprising at least two thin film transistors (TFTs);
an insulating layer on the pixel circuit layer;
at least two micro LEDs on the insulating layer and embedded in the insulating layer, each of the at least two micro LEDs comprising a first end adjacent to the pixel circuit layer and a second end opposite to the first end and exposed from the insulating layer;

at least two first electrodes, each of the at least two first electrodes being between the first end of each of the micro LEDs and the pixel circuit layer; and at least one second electrode covering the second end of each of the micro LEDs, the at least one second electrode being transparent, wherein each of the first electrodes comprises a light transmitting region transmitting light emitted from the micro LED;

wherein regions of the pixel circuit layer overlapping the light transmitting regions of the first electrodes are transparent; and the substrate is transparent; and all of the TFTs are located in positions that do not overlap with the light transmitting region of each of the first electrodes;

wherein each first electrode defines a non-light transmitting region; each of some TFTs is located under the non-light transmitting region of one first electrode and overlaps with the non-light transmitting region of the one first electrode; and each of other TFTs is located in a position overlapping between two adjacent micro LEDs; and wherein each of the first electrodes defines a through hole extending through the first electrode, the through hole defines the light transmitting region.

2. The micro LED display panel of claim 1, wherein the non-light transmitting region of each of the first electrodes is made of a nontransparent and conductive material.

3. The micro LED display panel of claim 1, wherein a projection of each of the first electrodes on the substrate is greater than a projection of each of the micro LEDs coupled to the first electrode on the substrate.

4. The micro LED display panel of claim 1, wherein each of the micro LEDs comprises a sidewall connecting between the first end and the second end; the sidewall of each of the micro LEDs is covered by an adjusting electrode; the adjusting electrode is electrically insulated from each of the first electrodes and the at least one second electrode.

5. The micro LED display panel of claim 4, wherein the sidewall of each of the micro LEDs is covered by a dielectric layer; the dielectric layer is formed on a side of the adjusting electrode adjacent to the micro LED and between the micro LED and the adjusting electrode.

6. The micro LED display panel of claim 5, wherein the dielectric layer extends to partially cover the second end of the micro LED.

7. The micro LED display panel of claim 4, wherein the insulating layer comprises a first insulating layer on the pixel circuit layer and a second insulating layer on a side of the first insulating layer away from the pixel circuit layer; each of the micro LEDs is embedded in the first insulating layer and the second insulating layer; the second end of each of the micro LEDs is exposed from the second insulating layer.

8. The micro LED display panel of claim 7, further comprising at least one connecting electrode between the first insulating layer and the second insulating layer, wherein the connecting electrode is in direct contact with and electrically coupled to the adjusting electrode.

\* \* \* \* \*